Figure 1:
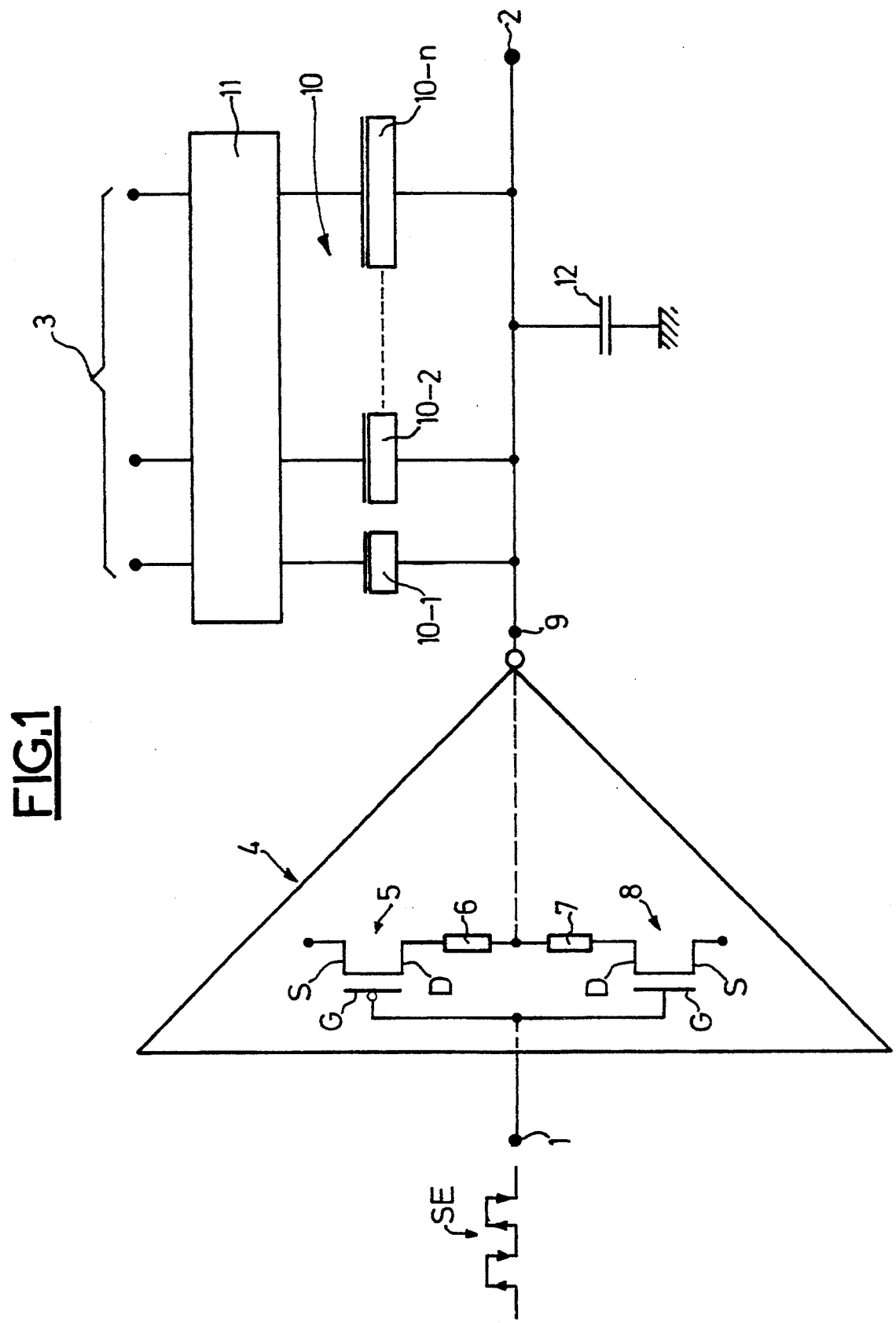

United States Patent [19]

Rainard

[11] Patent Number: 5,416,436
[45] Date of Patent: May 16, 1995

[54] METHOD FOR TIME DELAYING A SIGNAL AND CORRESPONDING DELAY CIRCUIT

[75] Inventor: Jean L. Rainard, La Terrasse, France

[73] Assignee: Francen Telecom, Paris, France

[21] Appl. No.: 124,772

[22] Filed: Sep. 21, 1993

[30] Foreign Application Priority Data

Sep. 22, 1992 [FR] France ................. 92 11267

[51] Int. Cl.⁶ ............................................. H03H 11/26
[52] U.S. Cl. ..................................... 327/270; 327/272; 327/278
[58] Field of Search ............... 307/603, 602, 601, 605, 307/597, 585, 246; 361/277

[56] References Cited

U.S. PATENT DOCUMENTS 4,016,511  4/1977  Ramsey et al. ................. 383/29
5,117,206  5/1992  Imamura ........................ 361/277

FOREIGN PATENT DOCUMENTS

0059802A1  9/1982  European Pat. Off. ..... H03H 17/00
0136203A1  4/1985  European Pat. Off. ..... G01R 31/28
0423963A2  4/1991  European Pat. Off. ..... H03K 5/13
0439203A3  7/1991  European Pat. Off. ..... H03K 5/13
0474534A1  3/1992  European Pat. Off. ..... H03H 11/26
2246256   12/1990  United Kingdom ........... 302/597

*Primary Examiner*—William L. Sikes
*Assistant Examiner*—James A. Dudek
*Attorney, Agent, or Firm*—Arnold, White & Durkee

[57] ABSTRACT

The variable and controllable delay circuit having a signal input (1), a control input (3) for a control signal, a signal output (2) for delivering a signal which is time delayed with respect to the input signal (SE), and delay means including a logic circuit (4) connected between the signal input and the signal output, as well as a load circuit including a capacitive load (10) connected at the output (9) of the logic circuit (4); the impedance of the load circuit is alterable under the action of the control signal in order to vary the said delay. The capacitive load (10) is variable under the action of the control signal (b3, b2, b1) to take different capacitive values.

12 Claims, 3 Drawing Sheets

METHOD FOR TIME DELAYING A SIGNAL AND CORRESPONDING DELAY CIRCUIT

This application is a United States counterpart to the French Application Ser. No. 9211267, which was filed Sep. 22, 1992. Applicant claims the priority date of these foreign filings.

The invention relates to the production of a variable and controllable delay for time delaying a signal.

Variable delay circuits are used in numerous devices such as voltage-controlled oscillators, phase lock loops, delay lines or oversampling systems. Having regard to this very great usefulness, variable delay circuits have been the subject of numerous studies and have arrived at various production techniques which the person skilled in the art usually groups into three main families.

The first family relates to delay circuits produced with the aid of differential amplifiers in which the variation in the propagation time between the input and the output is obtained by acting on the common-mode current. Such an embodiment is described, for example, in the article by Giebel and others, Digitally Controlled Oscillator, IEEE Journal of Solid-state Circuits, Vol. 24, No. 6, June 1989.

Another family of delay circuits groups together those called current starving delay circuits, which are based on conventional inverting structures, for example CMOS technology inverters, in which the propagation time varies as a function of the maximum supply current which is imposed on them by an appropriate control system. To this end, mention may be made of the article by Deog-Kyoon Jeong and others, Design of PLL-based Clock Generation Circuits, IEEE Journal of Solid-State Circuits, Vol. sc-22, No. 2, April 1987.

The third family groups together variable-load delay circuits which exploit the variation in the propagation time of a logic circuit, such as an inverter, as a function of the value of its output load. Such an exemplary embodiment is illustrated in the article by Johnson and others, A Variable Delay Line PLL for CPU-Coprocessor Synchronization, IEEE Journal of Solid-State Circuits, Vol. 23, No. 5, October 1988. In this previous delay circuit, the output load consists of a field-effect transistor connected in series with a capacitor. The field-effect transistor is controlled on its gate by a control signal and can be considered as a voltage-controlled resistor whose variation in value alters the impedance of the output load and consequently the charge and the discharge time of the capacitor, which has an influence on the value of the delay.

All the embodiments of this third family are, by construction, controlled by a continuous, analog control signal (voltage or current). This leads to two principal drawbacks. The analog control signals used to set the delay values are sensitive to the internal noise of the circuit, which then has a repercussion on the value of the final time delay. Moreover, the variation in the delay as a function of the control current or of the voltage is not linear and difficulties in implementation generally stem therefrom.

The invention aims to afford a solution to these problems.

It proposes a delay circuit of the type belonging to the third abovementioned family, but in which the operating principle and the structure differ radically from those already known.

The object of the invention is also to obtain a linearity in the progression of the delay as a function of the control signal.

Another aim of the invention is directly to control the variation in the delay by a digital signal.

A further object of the invention is to propose a delay circuit the production of which is very simple and does not have recourse to analog techniques.

The subject of the invention is thus a method for time delaying a signal by a variable and controllable delay, in which a capacitive load of a load circuit is connected at the output of a logic circuit able to receive the said signal as input and to deliver a delayed signal as output, and in which the impedance of the load circuit is altered in order to vary the said delay; according to a general characteristic of the invention, the impedance of the load circuit is altered by altering the intrinsic capacitive value of the capacitive load.

Such a method thus makes it possible advantageously to control the alteration of the values of the capacitive load by a digital word. It is thus possible to confer, on the capacitive load, discrete values taken from among a defined set of values. According to a preferred embodiment, discrete values following a substantially linear progression are conferred successively on the capacitive load.

The subject of the invention is also a variable and controllable delay circuit, comprising a signal input, a control input for a control signal, a signal output for delivering a signal which is time delayed with respect to the input signal, and delay means including a logic circuit connected between the signal input and the signal output, as well as a load circuit including a capacitive load connected at the output of the logic circuit, the load-circuit impedance being alterable under the action of the control signal in order to vary the said delay; according to a general characteristic of the invention, the capacitive load is variable under the action of the control signal to take different capacitive values.

The capacitive load advantageously includes at least one capacitor which is controllable under the action of the control signal in order to take a passive state in which it has no effect on the value of the delay and an active state in which it influences the value of the delay.

According to one embodiment, the capacitor includes an insulated-gate field-effect transistor whose drain and source are linked to the output of the logic circuit and whose gate is linked to the control input; the capacitor is then in its active or passive state depending on the value of the gate voltage relative to the threshold voltage of the transistor.

The control signal advantageously includes a digital word; hence, the delay means include means able to receive the control signal and to deliver a control voltage to the gate of the transistor, capable of taking two different values depending on the value of the digital word, these two values being situated on either side of the threshold voltage.

The capacitive load may include a plurality of capacitors connected at the output of the logic circuit, which are controllable individually or as a group under the action of the control signal.

According to a preferred embodiment of the invention, the plurality of controllable capacitors connected in parallel to the output of the logic circuit possess respective capacitive values forming a geometric series with common ratio 2, the control signal then including a plurality of successive digital words successively capable of activating at least one of the capacitors in a predetermined order conferring capacitive values on the capacitive load forming an arithmetic series.

For preference, it is then possible to choose capacitors with elementary capacitive values which are substantially identical and are grouped together in groups containing respective numbers of capacitors forming the said geometric series with common ratio two; each digital word of the control signal then activates at least one group of capacitors in a predetermined order in order to obtain the step of the said arithmetic series equal to the elementary capacitance.

The logic circuit is preferably an inverter including two complementary insulated-gate field-effect transistors of which the P-channel field-effect transistor advantageously possesses a channel width greater than that of the N-channel transistor of this inverter.

According to another embodiment of the invention, the load circuit may include a plurality of similar delay means connected in series.

Figure 2:
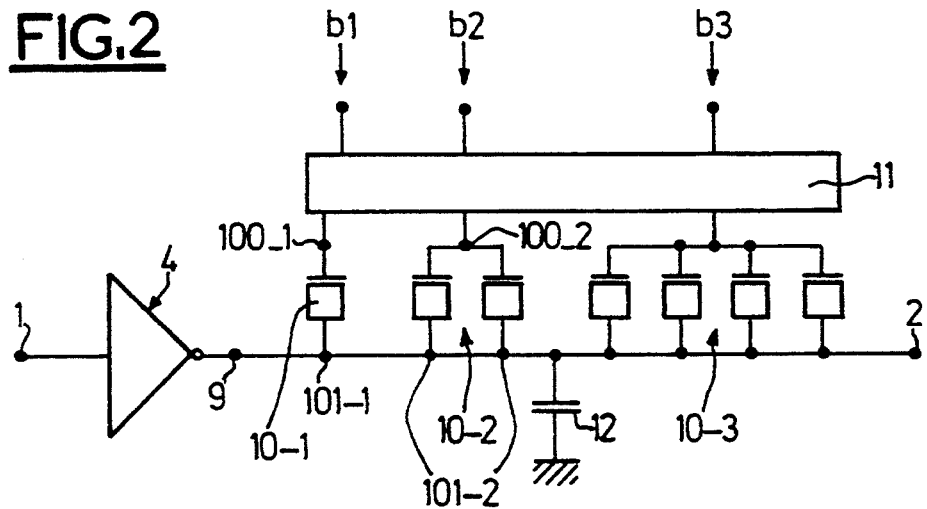
Figure 3:
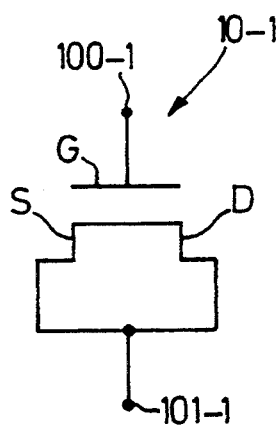
Figure 4:
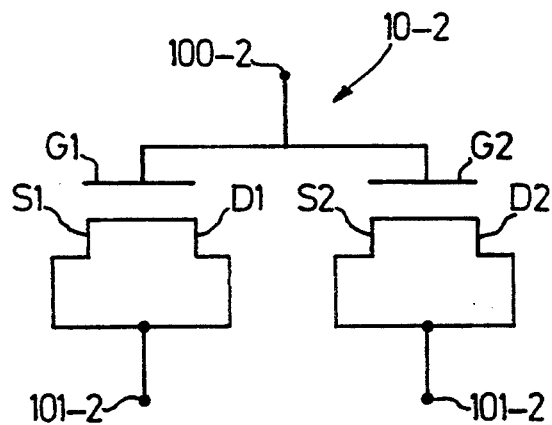
Figure 5:
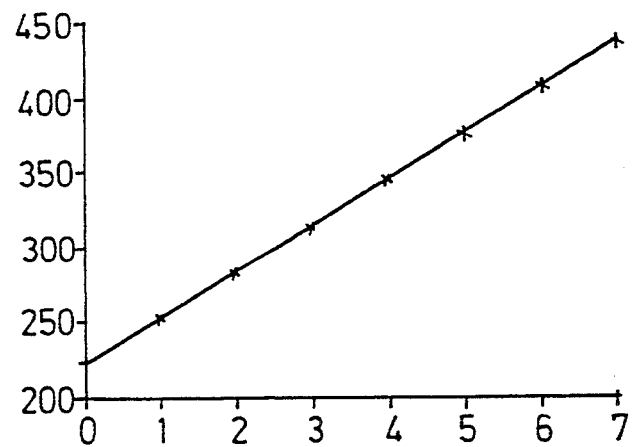
Figure 6:
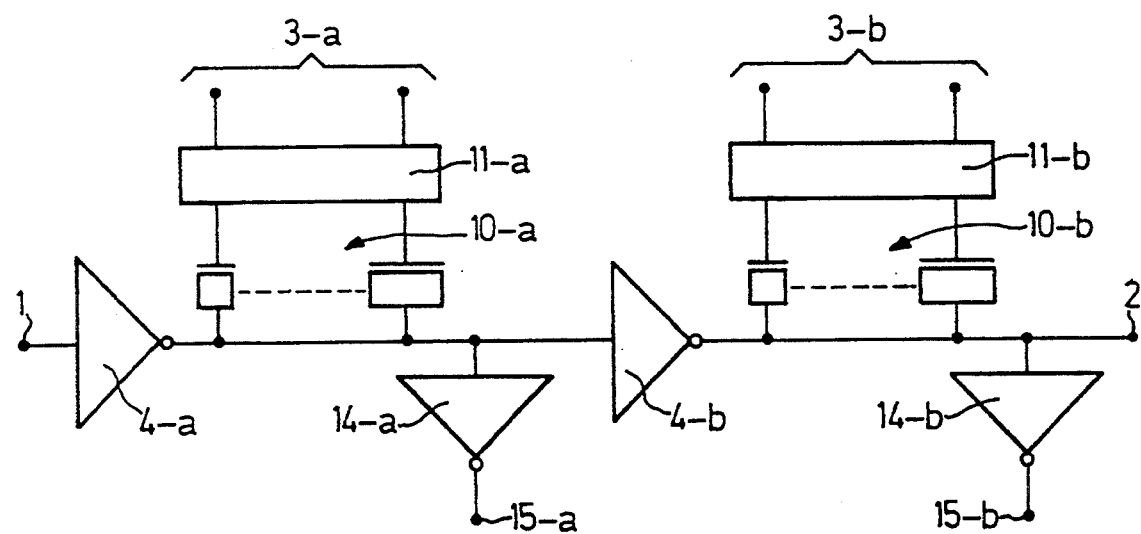

Other advantages and characteristics of the invention will appear on examining the detailed description of an embodiment which is in no way limiting and is illustrated on the drawings in which:

FIG. 1 represents a block diagram of a delay circuit according to the invention, FIG. 2 represents the grouping of capacitors of the circuit of FIG. 1 in more detail, FIGS. 3 and 4 illustrate embodiments of these capacitors, FIG. 5 represents a progression of the delay obtained as a function of the control signal, and FIG. 6 illustrates another embodiment of the delay circuit according to the invention.

In FIG. 1, reference 1 designates a signal input of the delay circuit while reference 2 relates to a signal output able to deliver an output signal which is time delayed with respect to the input signal. This input signal SE advantageously consists of an alternating series of rising and falling edges. Between this signal input and this signal output are connected delay means, here including a logic inverter 4 whose input is linked to the signal input and whose output 9 is linked to the signal output 2. Here, this inverter 4 is conventionally produced from two complementary insulated-gate field-effect transistors 5 and 8, whose respective drains D are linked to the output of the inverter and whose respective gates G are linked to the input of this inverter. The insulated-gate field-effect transistors 5 and 8 exhibit a resistive component of which the resistive values have been diagrammatically represented here by two resistors 6 and 7 connected respectively between the drains of the transistors and the output of the inverter.

At the output 9 of this inverter 4 there is connected a capacitive load 10 here consisting of a plurality of capacitors in parallel 10-1 ... 10-n. This capacitive load 10 is linked to a control input 3, able to receive a control signal, via logic means 11, the structure and the function of which will be returned to in more detail later. The capacitor 12 connected between the output 9 of the inverter and the earth represents the parasitic capacitance Cp of the circuit.

The capacitive load 10, the parasitic capacitor 12 and the resistors 6 and 7 of the insulated-gate field-effect transistors 5 and 8 form a load circuit for these delay means. According to the general operating principle of such a delay circuit, the capacitive load 10 will successively charge and discharge through resistors 6 and 7.

The inverter 4 will change state, that is to say will deliver a falling edge in the presence of a rising edge at the input and vice-versa, generally at the end of the time necessary for the capacitive load to reach half of its charge. However, this charge and discharge time depends on the time constant RC of the load circuit, in which R designates the resistive value and C the capacitive value of this load circuit. According to the invention, this time constant is altered by directly altering the intrinsic capacitive value of the capacitive load 10. This principle is thus completely different from that previously known which consists in acting on the value of the resistance by modulating its value by an analog control signal (voltage or current).

The control signal used here, and arriving at the control input 3, is a digital word making it possible to activate or to de-activate at least one of the capacitors 10-1 ... 10-n of the capacitive load 10, according to the value of the bits of this digital word. A capacitor will be considered as activated and will then be in a state known as "active" when, under the action of the control signal, it will be capable of charging and discharging in order to have an influence on the value of the delay. In contrast, such a capacitor will be considered as de-activated, and will be in a passive state when, under the action of the control signal, it will have no influence on the value of the delay. It is appropriate to note here that the use of a digital word as control signal makes it possible to control a capacitor in on- or off mode, that is to say to consider it as integrally incorporated into the load circuit with its nominal intrinsic capacitive value or also to consider it as non-existent with respect to this load circuit. It is thus not envisaged here to modulate the capacitive value of such a capacitor, contrary to what it was possible to do for a resistor with an analog control signal in the devices of the prior art. Hence a delay circuit is therefore obtained which is highly insensitive to noise and which makes it possible directly to obtain good linearity of the progression of the delay as a function of the control, with an appropriate choice of capacitance.

This latter capability is obtained by successively conferring, on the capacitive load 10, discrete values taken from among a predetermined set of values, and according to a substantially linear progression. Such an embodiment is illustrated in FIG. 2.

The capacitive load 10 consists of several groups (here three) of capacitors all having substantially the same elementary intrinsic capacitive value C. The respective numbers of capacitors of these different groups from a geometric series with common ratio 2. Thus, the first group 10-1 includes only a single capacitor while the second group 10-2 includes two of them and the third group 10-3 includes four of them. That being so, at the output of the inverter, a plurality of controllable capacitors is obtained, possessing respective capacitive values forming a geometric series with common ratio 2 and with a first term. In fact, the capacitive value of the first group is equal to C, while that of the second group is equal to 2 C and that of the third group is equal to 4 C.

The control signal will then advantageously consist of several digital words each composed of a plurality of bits, equal in number to the plurality of groups (here three), all these digital words being capable successively of activating at least one of these groups in a predetermined order conferring, on the capacitive load 10, capacitive values forming an arithmetic series with a step equal to the value C of the elementary capacitance. In other words, if each digital word of the control signal includes three bits b1, b2, b3, and if values are conferred on the bits of each of these digital words such that the first group 10-1, then the second group, then the first and the second groups together, then the third group, then the third and the first groups together are successively activated, and so on, then for the capacitive load 10, values equal successively to C, 2 C, 3 C, 4 C, 5 C, etc. will be obtained.

Each capacitor may consist, for example, of an N-channel insulated-gate field-effect transistor, as illustrated in FIG. 3. The gate G of this transistor is linked to the terminal 100-1 which is itself linked to the output of the means 11 while the source S and the drain D of such a transistor are linked together to the terminal 101-1 linked to the output 9 of the inverter. Hence, in such an embodiment, the capacitor is in its active or passive state depending on the value of the gate voltage relative to the threshold voltage of the transistor. In fact, if the gate voltage is at a voltage lower than the threshold voltage, the channel region situated under this gate is not depleted and the field-effect transistor then exhibits a capacitance connected between the gate and the substrate, which thus has no influence with respect to the inverter 4. In contrast, if the gate is brought to a voltage above the threshold voltage, the channel region is depleted and the transistor exhibits a capacitance connected between the gate and the drain (and the source) which makes it active with respect to the inverter 4.

It would have been possible, in place of an insulated-gate field-effect transistor doing the job of a capacitor, to use a capacitor of equivalent capacitive value, controlled by a transistor, for example a field-effect transistor. In this case, the capacitor would be linked between the drain of the transistor and the output 9 of the inverter and would be electrically incorporated into the load circuit depending on the gate voltage of the transistor then acting as a simple switch.

In the case of the second and third groups including capacitors in parallel, it is possible, as illustrated in FIG. 4 for the group 10-2, to use transistors connected in parallel. In this case, the two gates G1 and G2 of two transistors are linked together to the terminal 100-2 while the sources S1 and S2 and the drains D1 and D2 of these two transistors are linked together to the terminal 101-2.

The means 11 are able to receive the control signal and to deliver a control voltage to the gate of the transistor, which are capable of taking two different values depending on the value of the digital word, these two values lying on either side of the threshold voltage of the transistors. For the means 11, logic means such as logic gates will be used, for example, delivering a gate control voltage, zero or equal to 5 volts for example, depending on the value of the binary input word.

The direct digital control (that is to say without passing through the agency of an analog control, other than that, obviously, consisting solely in the delivery of two analog values corresponding directly to the two values of a bit) at high input impedance according to the invention, has made it possible, as illustrated in FIG. 5, to obtain a linearity of the variation of the propagation time Tp of the inverter as a function of the value of the control word, of the order of 1%. On this curve, the values 0 to 7 correspond to the eight decimal values of the eight successive digital words of the control signal, each composed of the bits b3, b2, b1, the corresponding binary values of these words going from 000 to 111. Needless to say, the person skilled in the art will have understood that this progression in the propagation time Tp of the inverter incorrectly described as linear is in fact a closely spaced progression in the mathematic sense of the term having regard to the value Cp of the parasitic capacitor 12 of the circuit.

The logic circuit used here is an inverter produced in CMOS technology, although other logic circuits can be used, for example based on NAND gates, on condition that these other logic circuits are configured so as not to give rise to over-large distortions between the shape of the input and output edges, which could be falsely interpreted as a delay. In the case in which an inverter with two complementary, insulated-gate transistors are used, it is preferable to provide transistors possessing dimensional characteristics which are chosen in such a way that these N- and P-channel transistors deliver the same maximum current in the same conditions. The person skilled in the art knows that the value of this current depends on the mobility of the carriers and on the dimensioning of the channel (length between drain and source, and width). Thus, since the mobility of the holes is markedly lower than that of the electrons, a channel width for the P-channel transistor greater than that of the channel of the N-channel transistor will advantageously be chosen, for the same CMOS technology. In practice, a double channel width will be adopted. Hence this avoids obtaining, as output, a signal which is "shrunk" with respect to the input signal, that is to say exhibiting a different spacing between the falling edges and the rising edges. Such a signal would be obtained with two complementary transistors with identical dimensional characteristics by reason of the higher resistive value of the P-channel transistor 5.

FIG. 6 illustrates an embodiment of the invention making it possible, in particular, to produce delay lines with multiple outputs, in which the delay circuit includes a plurality of analog delay means 4-a, 10-a, 11-a; 4-b, 10-b, 11-b, linked in series between the input 1 and the output 2. In this case, there is provision advantageously to use auxiliary inverters 14-a and 14-b connected at the output of each inverter 4-a and 4-b so as to decouple one elementary module from the following and to be able thus to pick off intermediate output signals at the terminals 15-a and 15-b without influencing the value of the delay determined by the value of the capacitive loads 10-a and 10-b.

I claim:

1. A method for time delaying a signal with a variable and controllable delay, comprising:
   connecting a capacitive load of a load circuit to the output of a logic circuit that is able to receive the signal as input and to deliver a delayed signal as output;
   altering the impedance of the load circuit in order to vary the delay, the impedance of the load circuit being altered by altering an intrinsic capacitive value of the capacitive load so as to confer on the capacitive load discrete values taken from among a predetermined set of values; and
   controlling directly the alteration of the values of the capacitive load by at least one digital word, wherein the different values of the capacitive load corresponds to different values of the at least one digital control word.

2. The method of claim 1, further comprising conferring discrete values following a substantially linear progression on the capacitive load.

3. A variable and controllable delay circuit, comprising:
- a signal input;
- a control input for a control signal;
- a signal output for delivering a signal which is time delayed with respect to the input signal; and
- a delay structure comprising a logic circuit connected between the signal input and the signal output and a load circuit including a capacitive load connected to the output of the logic circuit, an impedance of the load circuit being alterable under the action of the control signal in order to vary the delay, wherein the control signal includes at least one digital word, and the capacitive load is under the action of the control signal, able to take different discrete capacitive values that correspond directly to different values of the digital control word.

4. The circuit of claim 3, wherein the capacitive load includes at least one controllable capacitor that is controllable under the action of the control signal and that can take a passive state in which it has no effect on the value of the delay and an active state in which it influences the value of the delay.

5. The circuit of claim 4, wherein:
- the controllable capacitor includes an insulated gate field-effect transistor with a drain and a source that are linked to the output of the logic circuit and a gate that is linked to the control input; and
- the controllable capacitor is in an active or passive state depending on the value of a gate voltage relative to a threshold voltage of the transistor.

6. The circuit of claim 5, wherein the delay structure comprises a receiver capable of receiving the control signal and delivering a control voltage to the gate of the transistor by taking two different values depending on the value of the digital word, the two values being situated on either side of the threshold voltage.

7. The circuit of claim 3, wherein the capacitive load includes a plurality of controllable capacitors connected at the output of the logic circuit, the controllable capacitors being controllable individually or as a group under the action of the control signal.

8. The circuit of claim 7, wherein:
- the controllable capacitors connected in parallel to the output of the logic circuit possess respective capacitive values forming a geometric series with a common ratio of two; and
- the control signal includes a plurality of successive digital words capable of activating at least one of the capacitors in a predetermined order thereby conferring capacitive values on the capacitive load, the values forming an arithmetic series.

9. The circuit of claim 8, wherein:
- the capacitors are of substantially identical elementary capacitive values and are grouped in groups containing numbers of capacitors forming the geometric series with common ratio two; and
- the digital words of the control signal successively activate at least one group of capacitors in a predetermined order to confer a step equal to the elementary capacitors on the arithmetic series.

10. The circuit of claim 3, wherein the logic circuit is an inverter including two complementary insulated-gate field-effect transistors.

11. The circuit of claim 10, wherein a P-channel field-effect transistor of the inverter possesses a channel width greater than that of a N-channel transistor of the inverter.

12. The circuit of claim 3, further comprising a plurality of delay structures connected in series.

* * * * *